(12) United States Patent
Balzano et al.

(10) Patent No.: US 6,388,534 B1
(45) Date of Patent: May 14, 2002

(54) LASER CONTROLLED CRYSTAL AND DIELECTRIC RESONATOR OSCILLATORS

(76) Inventors: Alfiero Balzano, 11371 Monarch St., Garden Grove, CA (US) 92841; Armando Benavides, 2484 Roscomare Rd., Los Angeles, CA (US) 90077; Carl Peterson, 11371 Monarch St., Garden Grove, CA (US) 92841

( * ) Notice: Subject to any disclaimer, the term of this patent is extended or adjusted under 35 U.S.C. 154(b) by 0 days.

(21) Appl. No.: 09/605,492

(22) Filed: Jun. 28, 2000

Related U.S. Application Data

(60) Provisional application No. 60/141,010, filed on Jun. 29, 1999.

(51) Int. Cl.⁷ .............................. H03B 5/32; H03B 5/18
(52) U.S. Cl. .................. 331/175; 331/117 D; 331/158; 331/177 R; 331/177 V
(58) Field of Search ................. 331/66, 116 R, 331/116 FE, 117 D, 158, 175, 177 R, 117 V

(56) References Cited

U.S. PATENT DOCUMENTS

| | | | | |
|---|---|---|---|---|
| 4,639,690 A | * | 1/1987 | Lewis | 331/117 D |
| 6,018,386 A | * | 1/2000 | Radun | 356/213 |

* cited by examiner

*Primary Examiner*—David Mis
(74) *Attorney, Agent, or Firm*—Roger A. Marrs

(57) ABSTRACT

A crystal oscillator including a laser light source for emitting a laser beam to an aligned quartz crystal coupled to an oscillator circuit by an optical feedback network. The optical feedback network is responsive to variations of misalignment of the laser beam with the crystal and correction signals generated for introduction back to the crystal to bring its frequency back to a constant standard frequency output.

13 Claims, 4 Drawing Sheets

LASER CONTROLLED CRYSTAL AND DIELECTRIC RESONATOR OSCILLATORS

Priority claim based on Ser. No. 60/141,010 filed Jun. 29, 1999.

BACKGROUND OF THE INVENTION

1. Field of the Invention

The present invention relates to the field of electronic crystal oscillators, and more particularly to a frequency stability control for crystal oscillators including dielectric resonator oscillators, commonly referred to as DRO which reduces the number components, increases reliability and substantially reduces size, weight, and power consumption.

2. Brief Description of the Prior Art

In the past, it has been the usual practice to stabilize the frequency of crystal oscillators through the employment of low phase noise transistors biased at their minimum noise figure operating point and an automatic gain control loop to keep the voltage amplitude across the crystal constant. The oscillator is further stabilized by employing another loop for temperature control in order to maintain the crystal and the frequency sensitive elements at the optimum temperature of the crystal's high turnover point. For crystal oscillators with stringent long term stability requirements, an additional means is provided taking the form of a frequency control loop which is implemented with a Rubidium or Cesium cell known as the "physics package" serving as a series resonant circuit of extremely high quality (Q) factor. However, this approach to high frequency stability design is highly labor intensive, complicated and expensive due to the difficulty of circuit adjustment and number of component parts required.

In particular, when the frequency control loop is included in the "physics package", the loop contains circuitry to excite the lamp, and a thermostat for temperature control of the lamp. Additional circuitry is required to excite the electric field inside the lamp as well as servo-amplifiers, sweep circuits, and a low frequency error signal generator. The loop further includes a lock detector, a phase modulator and frequency multipliers. This degree of complexity reduces the reliability of the oscillator and substantially contributes further to an increase in size, weight, and power consumption. Therefore, the present invention is intended to overcome the above recited shortcomings of conventional Rubidium and Cesium standards.

Also, it has been the conventional practice to frequency stabilize microwave DRO's by phase locking the oscillator to another signal typically derived from a crystal source. This approach to high frequency stability design is highly labor intensive, complicated, expensive and inefficient because it requires successive multiplication and filtering of a low frequency signal with higher stability at the expense of higher power consumption and lower reliability. Also, as part of the multiplication process, the enhanced phase noise of the crystal source appears at the reference frequency resulting in loop design trade-offs between noise band widths and lock-in ranges.

Therefore, a long-standing need has existed to provide a DRO phase-locking technique which extends to stability enhancement of lower frequency crystal oscillators while overcoming the above problems.

SUMMARY OF THE INVENTION

Accordingly, the above problems and difficulties are avoided by the present invention which provides a novel technique to stabilize the frequency of a crystal oscillator by passing through the crystal or reflecting from the crystal two light beams. These two beams are formed from one common laser source passing through a beam splitter. After passing through the crystal or reflected from the crystal, the beams are combined and allowed to interact. Since these beams propagate through different path lengths, the result of their interaction is a beam where energy is polarized at an angle that changes if the difference in path propagation length changes. The combined beam is split again by a splitter-polarizer lens, resulting in two beams in which the energy of one contains vertical polarization only and the energy in the other horizontal polarization only. Any shift in propagation path length difference due to crystal displacement changes, causes the magnitude of these energies to change in opposite directions. The light of these polarized beams is photo-detected and converted to electric signals, and by comparing these two signals an error signal is obtained that is used to change the excitation current that passes through the crystal. The piezoelectric effect forces the crystal displacement change back to zero thus achieving frequency stability control and phase noise reduction.

Also, the present invention provides a frequency stability for a DRO or a crystal oscillator by employing a laser beam and interferometer. In another form of the invention, a laser source generates a beam to a beam splitter which then introduces the split beam to a mirror that then introduces the reflection to a dielectric resonator as well as to a beam combiner followed by introduction to a beam splitter and then through photo detectors to a phase/frequency control loop circuit. The output of the circuit is then looped back to the dielectric resonator via an interferometer including a matching network. Thereby, the phasing frequency of the dielectric resonator is adjusted by the feedback loop.

Therefore, it is among the primary objects of the present invention to provide a frequency stability means for a DRO or crystal oscillator employing a laser beam source and an interferometer.

Another object of the present invention is to provide an improved means for gaining long-term frequency stability of crystal standards or free-running DRO's by at least one order of magnitude.

Yet another object of the present invention is to improve the phase noise ratio of crystal standards and free-running DRO's by employing laser techniques.

Yet another object is to provide a stabilized DRO which is lighter in weight, more reliable in performance and far more economical to produce and fabricate than can be achieved with conventional phase-locked DRO's.

A further object resides in providing a frequency standard which is lighter in weight, more reliable in performance and more economical to fabricate than conventional standards.

Also, it is among the primary objects of the present invention to provide a novel frequency stabilizing means for a crystal oscillator, which employs a laser beam and a Michelson interferometer.

Another object of the present invention is to provide a long-term frequency stability control of a crystal oscillator by improving the standards by at least one order of magnitude.

Another object of the present invention is to improve the phase noise characteristics of crystal oscillators by at least a factor or two.

Another object of the present invention is to provide a novel laser controlled crystal oscillator that reduces the size, weight and power consumption of conventional frequency standards.

Still a further object of the present invention is to provide a novel frequency control stabilization means for crystal oscillators employing a laser control feature, that is more reliable and more economical to fabricate, calibrate and maintain than otherwise possible with conventional frequency standards.

BRIEF DESCRIPTION OF THE DRAWINGS

The features of the present invention which are believed to be novel are set forth with particularity in the appended claims. The present invention, both as to its organization and manner of operation, together with further objects and advantages thereof, may best be understood with reference to the following description taken in connection with the accompanying drawings in which:

DESCRIPTION OF PREFERRED EMBODIMENTS

Figure 1:
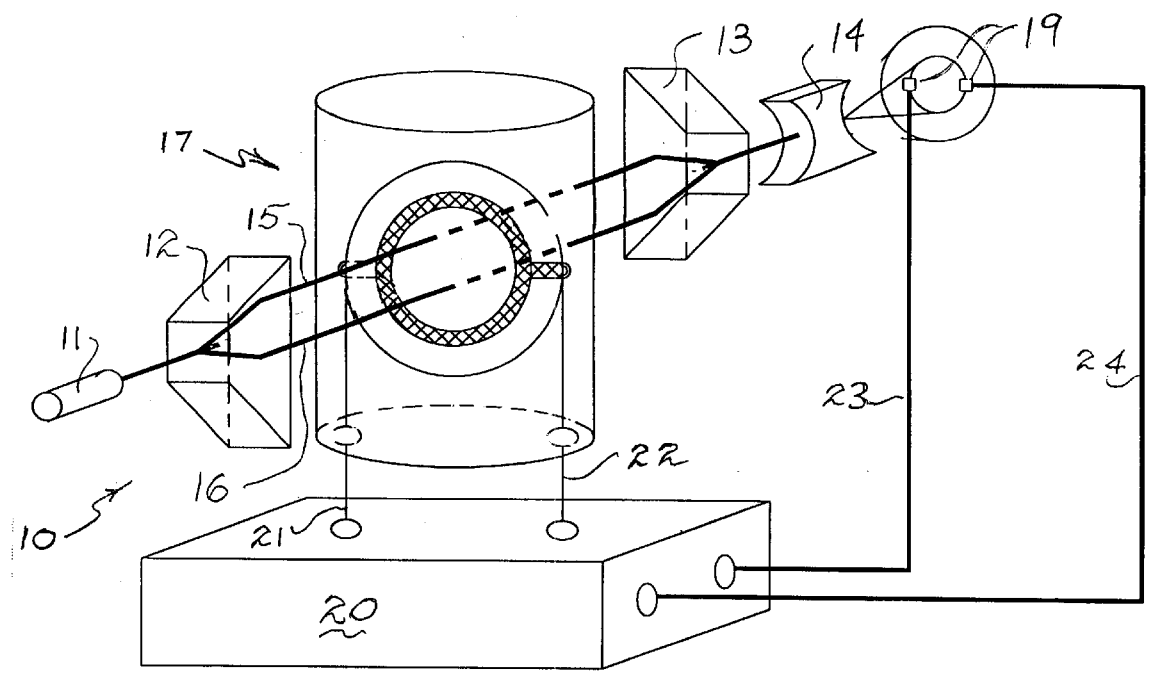
FIG. 1 is a diagrammatic view illustrating the laser controller crystal oscillator incorporating the present invention.
Figure 2:
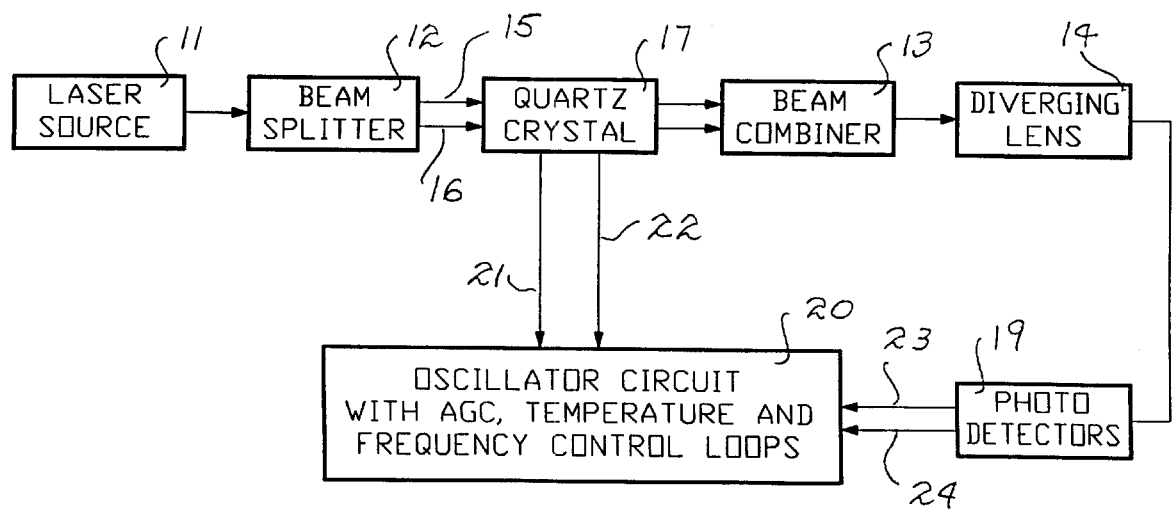
FIG. 2 is block diagram showing the control sequence and arrangement of components employed in the oscillator system of FIG. 1.

Referring to FIGS. 1 and 2, the novel laser controlled crystal oscillator is indicated in the general direction of arrow 10 and is illustrated as being provided with a crystal oscillator circuit 20 that includes automatic gain control and temperature control loops. A laser source 11 generates a beam which is directed to a beam splitter 12, beams 15 and 16 go through or are reflected by crystal 17 and then directed to a beam combiner 13. The combined beam is introduced to and incides upon a splitter-polarized lens 14. One of the two emerging beams contains vertically polarized light only while the other contains horizontally polarized light only. These two beams incide a pair of photo detectors 19. Electric currents generated by the photo detectors are introduced via lines 23 and 24 to the oscillator circuit 20. Therefore, it can be seen that the frequency control loop is implemented by the laser source, the beam splitter, the beam combiner, the splitter-polarizer and the photo detector circuits.

A beam of coherent monochromatic light is emitted from a laser diode acting as the laser source 11 and is split into two beams 15 and 16 so that phase and amplitude coherence is established between the beams. The beams are transmitted through the quartz crystal or reflected from the quartz crystal 17 at two specific locations where the lateral displacement sensitivity of the crystal is maximum. The refracted or reflected beams are routed to the beam combiner 13 where they interact resulting in a beam with polarization angle changes if the path length difference between beams 15 and 16 changes. The combined beam is made to incide on the splitter-polarizer lens 14 from which two beams emerge, one vertically polarized only and the other horizontally polarized only. These two beams are directed to photo detectors 19 where their light intensity is converted to electric signals and by comparing their amplitude an error signal is formed that drives the frequency control loop. Any crystal displacement changes within a quarter wavelength of the laser light will generate an error signal that changes the phase of the excitation current that passes through the crystal. The piezoelectric effect forces the crystal's displacement back to zero to achieve frequency stability control and reduction of phase noise. Thus, the accuracy of the crystal oscillator is greatly improved, especially when employed in clock or timekeeping applications.

Figure 3:
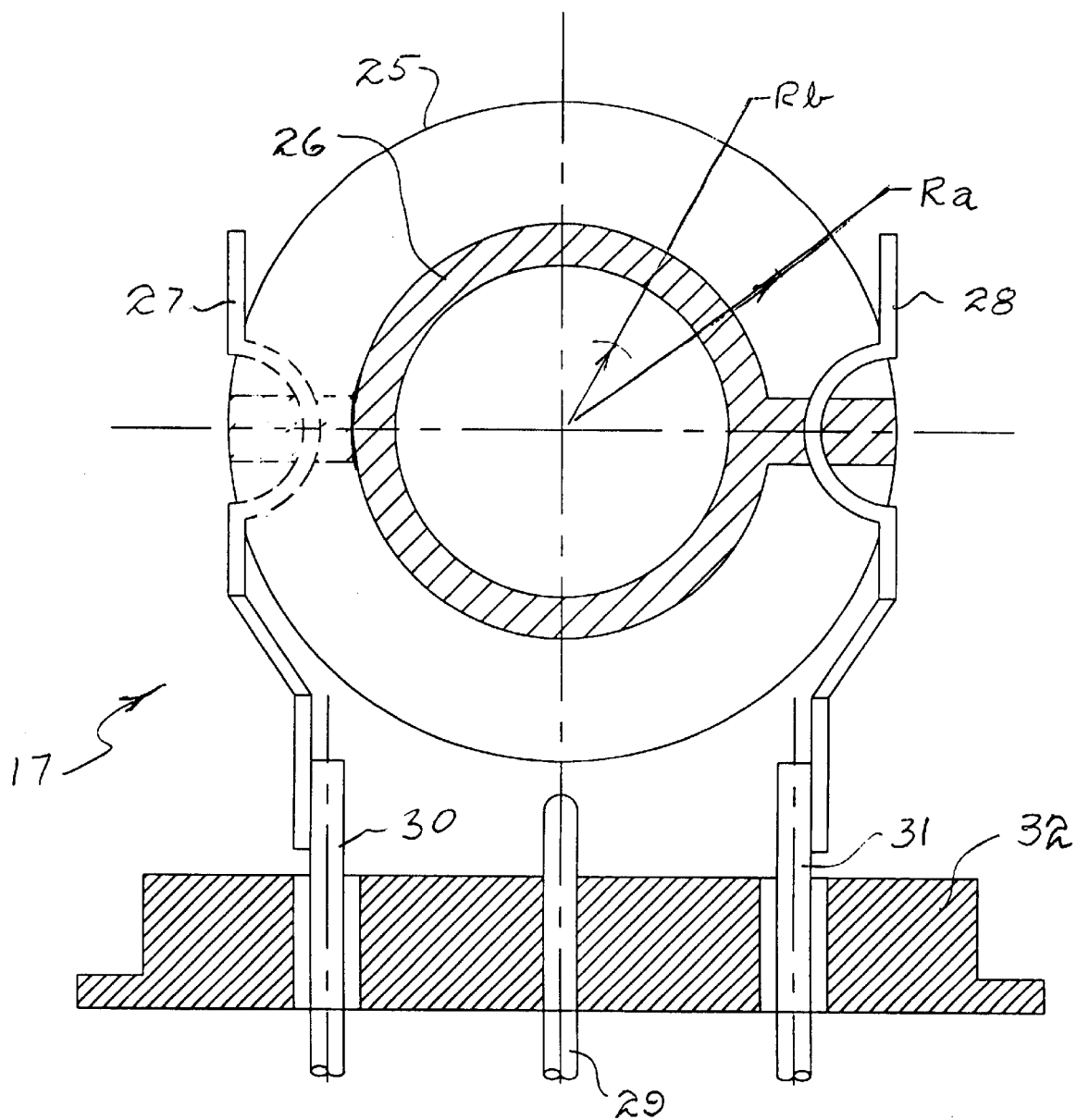
FIGS. 3 and 4 are diagrammatic views of a metallic vibrating crystal.

Referring now in detail to FIG. 3, the quartz crystal 17 is illustrated with an advanced metallization pattern that enables the laser beams to pass through the points of maximum displacement sensitivity and also provide the electrical contacts required for crystal excitation. The metallization pattern is accomplished so as not to impede, dampen, obstruct or prohibit the transmission of laser light through the crystal.

FIG. 3 depicts a preferred approach for preparing the metallization of a crystal when a light transmission technique is to be used instead of a light reflection technique. Since an electrical connection is required at diametrically opposed points, the metallization would take the form of two equal paths so as not to interrupt the symmetry or temperature effects, but will allow laser light to pass through the crystal at optimum inflection points in order to control the frequency of operation of oscillator 10. Numeral 25 indicates the crystal while numeral 26 indicates the metallization which provides the same pattern on opposite side of the crystal. The contacts are indicated by numerals 27 and 28 on opposite sides of the crystal respectively. The inflection points are represented by Rb and Ra. The contacts 27 and 28 are connected to input electrode or terminal 30 and output electrode or terminal 31 which are then carried through a mounting block 32 and couple with the oscillator circuit. Electrode 29 is a grounding center pin to prevent noise and electrostatic build-up on the case of the oscillator or device. The center of the crystal within the circular metallization 26 is exposed and transparent to passage of the light beams.

Figure 4:
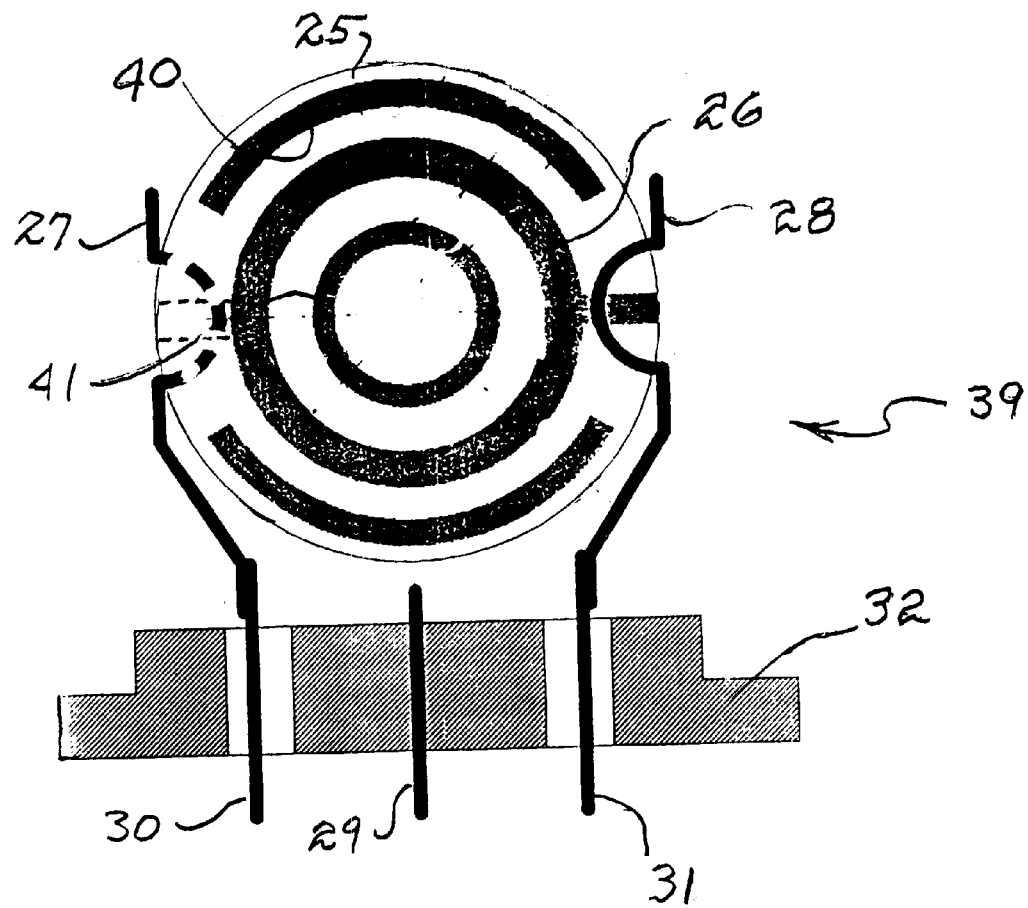

FIG. 4 illustrates a similar quartz crystal 25 to that shown in FIG. 3; however, crystal 39 is a quartz crystal having metal reflecting surfaces 40 and 41 receiving beams 15 and 16 respectively. The beams are reflected back out of the crystal to beam combiner 13 preparatory for introduction to the photo detectors.

Figure 5:
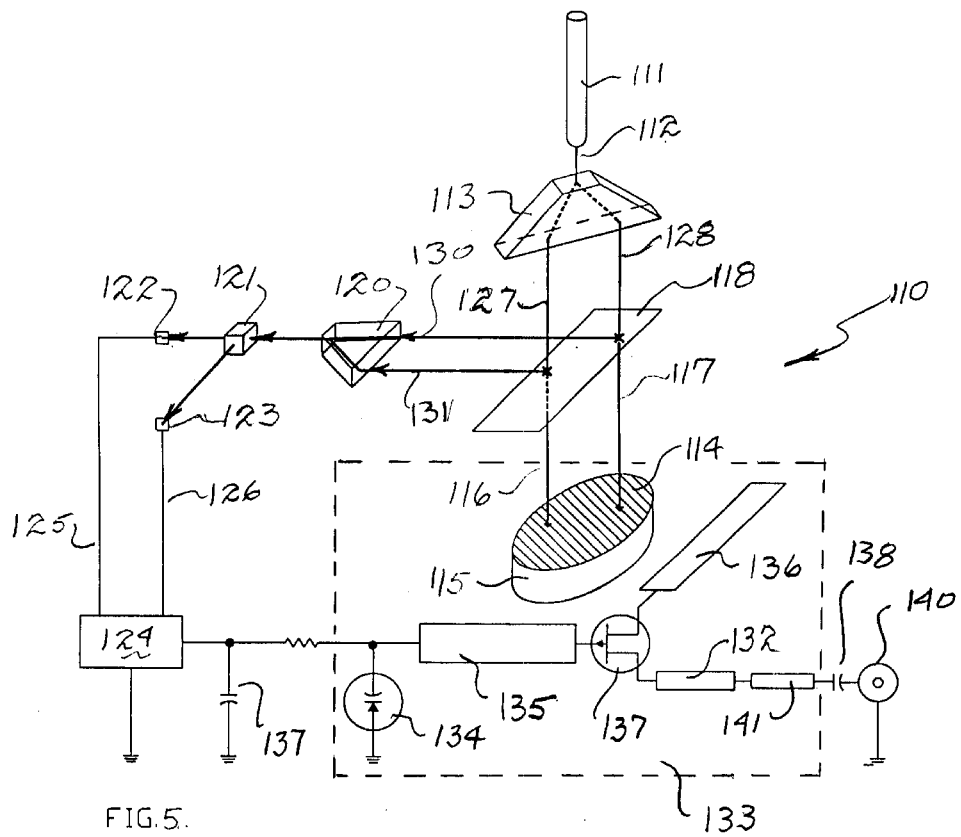
FIG. 5 is a diagrammatic view of a laser controlled DRO in accordance with the present invention.
Figure 6:
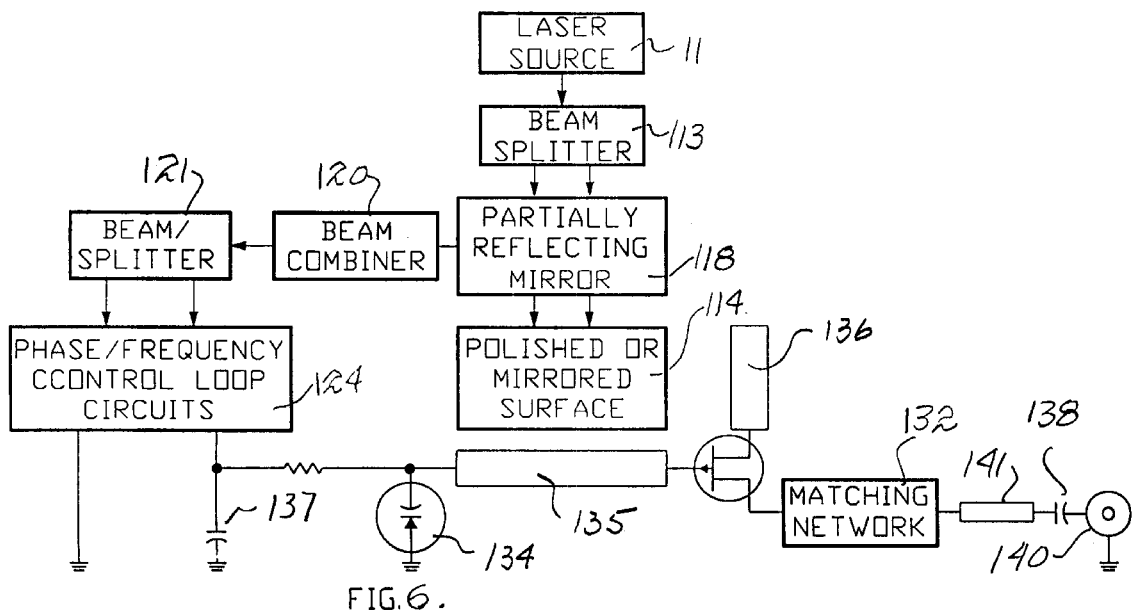
FIG. 6 is a block diagram of the laser controlled DRO illustrated in FIG. 1.

Referring to FIGS. 5 and 6, another embodiment of a crystal oscillator is a laser controller system for a dielectric resonant oscillator as indicated in the general direction of arrow 110. The system for control includes a laser source 111 for generating a beam 112 which is received by a beam splitter 113 and the output beams 127 and 128 of the beam splitter are introduced to a light reflecting surface 114 on a dielectric resonator 115 via a partially reflecting mirror 118. The reflected beams from the surface 114 are indicated by numerals 116 and 117 which are processed back through the partially reflecting mirror 118. The two reflected beam outputs from the partially reflecting mirror represented by numerals 130 and 131 which are then introduced to a beam combiner 120 which then introduces its single beam output to a beam splitter 121. The beam splitter 121 may also be referred to as a polarizer and its output is transmitted to a pair of photo-electric circuits or detectors 122 and 123 prior to introduction to a phase/frequency loop circuit 124 via lines 125 and 126.

In more detail, a light beam 112 projected from the diode in the laser source 111 is split into the two beams 127 and 128 which provide phase and amplitude coherence between the beams. The beams are reflected back from the surface 114 of the resonator to mirrored surface 118. The two reflected beams 130 and 131 are combined in the beam combiner 120 and allowed to interact yielding a fringe pattern. The resulting beam is split into the two beams 125 and 126 by the splitter-polarizer 121 and applied to individual photo detectors 122 and 123. The voltages on lines 125 and 126 from photo detectors 122 and 123 are compared forming an error signal that drives the phase/frequency control loop 125. Any resonator or crystal displacement changes within half a wavelength of the laser light will generate a signal that changes the phase of the excitation field interacting with the resonator 115 or current that passes through the crystal of the resonator. The piezoelectric effect forces the crystal's displacement change back to zero thus achieving phase/frequency stability control and reducing phase noise. In the DRO 133, the field interaction between the resonator and the transmission lines of the external circuit force the field change back to zero in order to achieve phase/frequency control.

A varactor diode 134 tunes the oscillator by changing the frequency thereof. Micro strip transmission lines are indicated by numerals 132, 135 and 136 and numeral 137 is a FET. A bypass capacitor 137 diverts RF energy to ground. A coupling capacitor 138 joins a coaxial adapter 140 to a transmission line 141.

An interferometer of the Michelson type may be employed in the circuit to produce simplicity and improve the long-term frequency stability of a dielectric resonator. The oscillator circuit interferometer is directly coupled to the phase/frequency control loop circuit 124 and forms a part thereof which includes various electronic components including a matching network.

The transmission line 136 couples RF energy from the drain of the FET into the dielectric resonator (frequency determining element) which in turn couples energy to the gate of the FET 137, (via transmission line 135) closing the feedback path and thus establishing oscillations. The mirrored or polished surface 114 reflects the two light beams used for optical loop control. Error signal developed by comparison of the two reflected light beams acts upon the varactor 134 keeping the oscillator frequency constant. The optical loop is sensitive to displacement changes in the top surface of the resonator and these changes are translated into electric signals for frequency control.

In view of the foregoing, it can be seen that the frequency stability means of the present invention for a DRO or a crystal oscillator is greatly improved with respect to the phase noise of crystal standards and free-running DRO's. Also, it can be seen that the shortcomings of conventional DRO phase-locking techniques are avoided and also the present invention extends to stability enhancement of lower frequency crystal oscillators.

The inventive concept stabilizes the frequency of an oscillator by means of an optical feedback loop using split laser beams that may be used in controlling frequency stability in such applications as atomic clocks with less power, weight, cost and higher reliability.

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

What is claimed is:

1. A crystal oscillator comprising:
a laser light source for emitting a laser beam;
a quartz crystal disposed in alignment with said laser light source for receiving said laser beam;
an oscillator circuit coupled to said quartz crystal and having a controlled frequency output; and
an optical loop means interconnecting said oscillator circuit with said quartz crystal whereby variation in displacement of said laser beam from alignment with said quartz crystal is reflected in change of said output frequency of said oscillator circuit.

2. The crystal oscillator defined in claim 1 wherein:
said oscillator circuit includes a correction circuit for changing said output frequency in accordance with said displacement of said laser beam with respect to said quartz crystal.

3. The crystal oscillator defined in claim 2 including:
a beam splitter interposed between said laser light source and said quartz crystal for issuing a pair of light beams to said quartz crystal for transference to said optical loop means.

4. The crystal oscillator defined in claim 3 wherein:
said optical loop means includes a beam combiner receiving said pair of light beams from said quartz crystal, a diverging lens for separating said combined pair of beams and a pair of photo detectors for receiving said separated light beams and for converting to electrical signals introduced to said oscillator circuit.

5. The crystal oscillator defined in claim 4 wherein:
said quartz crystal includes a mirror surface against which said laser beam impinges; and
a varactor diode circuit coupled to said quartz crystal and coupled to said correction circuit for changing said output frequency in response to said variations.

6. The crystal oscillator defined in claim 4 wherein:
said diverging lens is a splitter-polarizer lens resulting in an output of two beams in which energy of a first beam contains vertical polarization only and energy in a second beam contains horizontal polarization only whereby any shift in propagation path length difference due to displacement changes in said quartz crystal causes the magnitude of said polarization energies to change in opposite directions.

7. The crystal oscillator defined in claim 6 wherein:
said polarized light beams are directed to a photo detection circuit for conversion to electric signals; and
a comparison network receiving said electric signals for comparison and generation of an error signal for introduction to said oscillator correction circuit.

8. The crystal oscillator defined in claim 7 wherein:
said quartz crystal includes a center area transparent to passage of said pair of light beams.

9. The crystal oscillator defined in claim 7 wherein:
said quartz crystal includes a metallized ring with a reflective mirror surface for reflection of said pair of light beams to said optical loop means.

10. A laser controlled crystal oscillator comprising:
a laser light source emitting a laser beam;
a quartz crystal disposed in alignment with said laser light source for receiving said laser beam;
an oscillator circuit coupled to said quartz crystal and having a variable frequency output responsive to variations in displacement of said laser beam from alignment with said quartz crystal; and
said oscillator circuit providing feedback correction signals for modifying frequency output of said quartz crystal in response to variations of misalignment of said laser beam with said quartz crystal.

11. The crystal oscillator defined in claim 10 including:

an optical loop network interconnecting said oscillator circuit with said quartz crystal which includes a polarization means for separating said laser beam into a vertical polarization and a horizontal polarization.

12. The crystal oscillator defined in claim 11 wherein:
said quartz crystal is transparent to passage of said laser beam for transfer to said optical loop network.

13. The crystal oscillator defined in claim 11 wherein:
said quartz crystal includes a metallized surface for reflecting said laser beam to said optical loop network.

\* \* \* \* \*